United States Patent
Ting et al.

(10) Patent No.: US 6,894,917 B2
(45) Date of Patent: May 17, 2005

(54) DRAM REFRESH SCHEME WITH FLEXIBLE FREQUENCY FOR ACTIVE AND STANDBY MODE

(75) Inventors: Tah-Kang Joseph Ting, Hsinchu (TW); Chun Shiah, Hsin-Chu (TW); Shi Huei Liu, Taipei (TW)

(73) Assignee: Etron Technology, Inc., Hsin-Chu (TW)

( * ) Notice: Subject to any disclaimer, the term of this patent is extended or adjusted under 35 U.S.C. 154(b) by 28 days.

(21) Appl. No.: 10/346,588

(22) Filed: Jan. 17, 2003

(65) Prior Publication Data

US 2004/0141396 A1 Jul. 22, 2004

(51) Int. Cl.$^7$ .............................................. G11C 11/24
(52) U.S. Cl. ..................................... 365/149; 365/222
(58) Field of Search ................................. 365/222, 149

(56) References Cited

U.S. PATENT DOCUMENTS

| | | | | |
|---|---|---|---|---|
| 4,616,346 A | * | 10/1986 | Nakaizumi et al. | 365/229 |
| 5,247,655 A | * | 9/1993 | Khan et al. | 711/106 |
| 5,499,214 A | * | 3/1996 | Mori et al. | 365/222 |
| 6,094,705 A | | 7/2000 | Song | 711/106 |
| 6,137,743 A | * | 10/2000 | Kim | 365/222 |
| 6,199,139 B1 | * | 3/2001 | Katayama et al. | 711/106 |
| 6,212,599 B1 | | 4/2001 | Baweja et al. | 711/106 |
| 6,310,814 B1 | | 10/2001 | Hampel et al. | 365/222 |
| 6,363,024 B1 | | 3/2002 | Fibranz | 365/222 |
| 6,462,998 B1 | * | 10/2002 | Proebsting | 365/205 |

* cited by examiner

Primary Examiner—M. Tran
(74) Attorney, Agent, or Firm—George O. Saile; Stephen B. Ackerman

(57) ABSTRACT

The present invention provides a method and an apparatus for DRAM refresh with different frequencies of refresh for active and standby mode. In addition, this invention utilizes different refresh frequencies during active and standby modes to optimize power dissipation and DRAM data integrity. The refresh frequency during active mode is higher than said refresh frequency during standby mode. The refresh frequency during active mode is higher than the prior art refresh frequency during active mode. The refresh frequency during standby mode is lower than the prior art refresh frequency during standby mode. The higher active mode refresh frequency allows the faster restoration of cell data, which is degraded by capacitive discharge coupling through the selection of adjacent word lines. The low standby mode refresh frequency provides a lower standby power dissipation which compensates for the higher active mode power dissipation caused by the higher active mode refresh frequency.

28 Claims, 2 Drawing Sheets

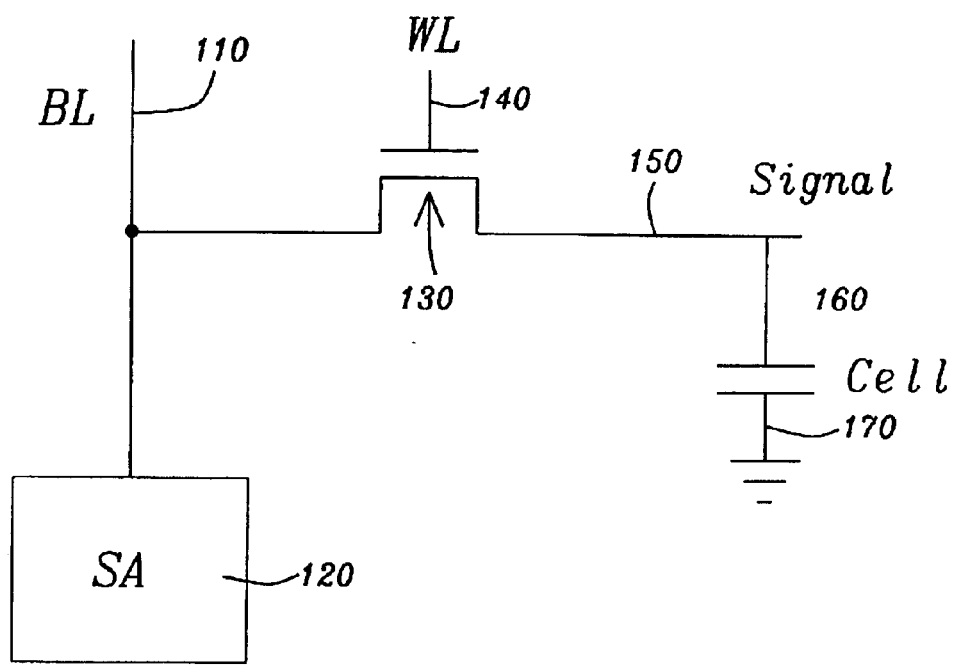
FIG. 1a – Prior Art
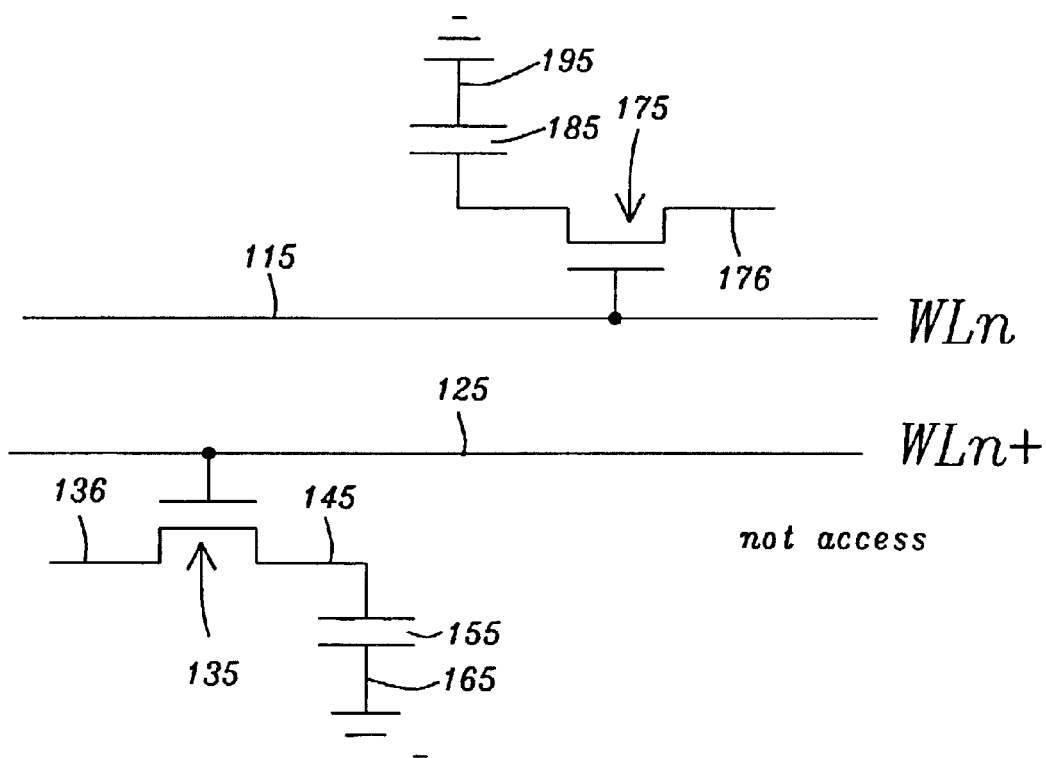
FIG. 1b – Prior Art

DRAM REFRESH SCHEME WITH FLEXIBLE FREQUENCY FOR ACTIVE AND STANDBY MODE

BACKGROUND OF THE INVENTION

1. Field of the Invention

The present invention generally relates a dynamic random access memory, DRAM refresh method and apparatus. More particularly, this invention relates to a DRAM refresh scheme with different frequencies of refresh for active and standby mode.

2. Description of the Prior Art

FIG. 1a shows the prior art memory cell and its reading and writing sub-systems. The bit line, BL 110 is shown attached to the sense amplifier, SA 120. The BL 110 is also attached to the n-channel metal oxide semiconductor field effect transistor NMOS FET 130. The BL 110 is attached to the drain of the FET 130. The gate of the FET is attached to the WL, word line 140. The source of the FET 130 is labeled signal 150. The signal voltage 150 is maintained by charging a capacitor or memory cell 160. The memory cell logic value of '1' or '0' is dynamically stored in the capacitor 160. The other mode of the capacitor cell 160 is attached to ground 170.

FIG. 1b shows a prior art view of two adjacent word lines, WLn and WLn+1. The example of FIG. 1b shows WLn 115 being selected and WL n+1 125 not selected or not accessed. FIG. 1b illustrates the case of the charge stored on memory cell capacitor 155 is affected, disturbed, or even changed by the WL line switching at WLn 115.

The unselected memory cell 155 is attached to the source of NMOS FET 135. The gate of NMOS FET 135 is attached to word line WL n+1 125. This WL n+1 125 is not switched or accessed in this example of FIG. 1b. The idle memory cell voltage is 145. The other node of the idle memory cell capacitor 155 is attached to ground, 165. The bit line is 136.

In FIG. 1b, the memory cell 185 being accessed by WLn 115 is shown. The WLn 115 is attached to the gate of NMOS FET 175. The bit line is attached to drain node 176 of the FET 175. The source of FET 175 is attached to the memory cell capacitor 185.

When the active word line WLn 115 is switched high to a logical '1'. There is positive capacitive coupling between the 2 word lines WLn and WLn+1. As a result if WLn+1 goes high, there is positive coupling via the Cgs, gate-to-source capacitance of FET 135. This could result in a voltage increase 145 at the memory cell capacitor 155. If there was previously a logical '0' stored in memory cell capacitor 155, the above word line coupling could cause a logical '0' at memory cell 155 to falsely change to a logical '1'.

When the active word line WLn is switched low to a logical '0'. There is negative capacitive coupling between the 2 word lines WLn and WLn+1. As a result if WLn+1 goes low, there is negative coupling via the Cgs, gate-to-source capacitance of FET 135. This could result in a voltage decrease 145 at the memory cell capacitor 155. If there was previously a logical '1' stored in memory cell capacitor 155, the above word line coupling could cause a logical '1' at memory cell 155 to falsely change to a logical '0'.

U.S. Pat. No. 6,363,024 (Fibranz) "Method for Carrying Out Auto Refresh Sequences on a DRAM" describes a method of refresh sequences automatically. The auto refresh sequence on a DRAM that is divided into memory banks is synchronized with the clock signal acting on the DRAM.

U.S. Pat. No. 6,310,814 (Hampel, et al.) "Rambus DRAM (RDRAM) Apparatus and Method for Performing Refresh Operations" describes an apparatus and method for simultaneously refreshing first and second rows of memory cells in a dynamic random access memory (DRAM) includes a plurality of banks of memory cells organized in rows.

U.S. Pat. No. 6,212,599 (Baweja, et al.) "Method and Apparatus for a Memory Control System Including a Secondary Controller for DRAM Refresh During Sleep Mode" describes a memory control system which includes a first memory controller designed to access and refresh a DRAM, using a clock, during a first operation mode.

U.S. Pat. No. 6,094,705 (Sony) "Method and System for Selective DRAM Refresh to Reduce Power Consumption" describes a method and system for selective refresh for a memory array is disclosed. The method and system comprises providing a plurality of valid bits, each of the valid bits is associated with a row of the memory device.

SUMMARY OF THE INVENTION

It is therefore an object of the present invention to provide a method and apparatus for DRAM refresh with different frequencies of refresh for active and standby mode. It is further an object of this invention to utilize the different refresh frequencies during active and standby modes to optimize power dissipation and DRAM data integrity.

The objects of this invention are achieved by providing a dynamic random access memory, DRAM, refresh method and apparatus with flexible frequency for active and standby mode. The scheme provides a higher refresh frequency for active mode than for standby mode. The refresh frequency during active mode is higher than the prior art refresh frequency during active mode. The refresh frequency during standby mode is lower than the prior art refresh frequency during standby mode. The refresh frequency during active mode is higher than said refresh frequency during standby mode. The higher active mode refresh frequency allows the faster restoration of cell data, which is degraded by capacitive discharge coupling through the selection of an adjacent word line. The standby frequency can be lowered since cell charge lost due to adjacent word line switching does not occur. During standby said word lines are not active. The higher refresh frequency during active mode causes active mode power dissipation to be greater than in the prior art. The lower refresh frequency during standby mode causes standby mode power dissipation to be lower than in the prior art. The higher power dissipation caused by the higher active mode refresh frequency is offset by the lower power dissipation due to said lower standby refresh frequency. A count of word lines determines worse case cell degradation due to the capacitive coupling due to activity on the adjacent word lines. The worst case number of word lines determines the higher refresh frequency required during the active mode. A flexible feature allows refresh frequency of active mode to vary according to word line counts. A flexible feature allows refresh frequency of standby mode to vary inversely according to word line count so as to compensate for higher active mode power dissipation. The refresh frequency during standby mode is decreased more to compensate for the required increase of the refresh frequency during active mode to insure power dissipation is compensated adequately to meet required design specifications. A sense amplifier is used to refresh said memory cells as needed during refresh time. The refresh operation activates the word lines in a repeating ring order.

The above and other objects, features and advantages of the present invention will be better understood from the following detailed description taken in conjunction with the accompanying drawings.

BRIEF DESCRIPTION OF THE DRAWINGS

FIG. 1a shows a prior art dynamic memory cell and its circuit sub-system.

FIG. 1b is a prior art diagram illustrating how the voltage and logical levels stored in memory cells are corrupted by adjacent word line switching.

DESCRIPTION OF THE PREFERRED EMBODIMENT

Figure 2:
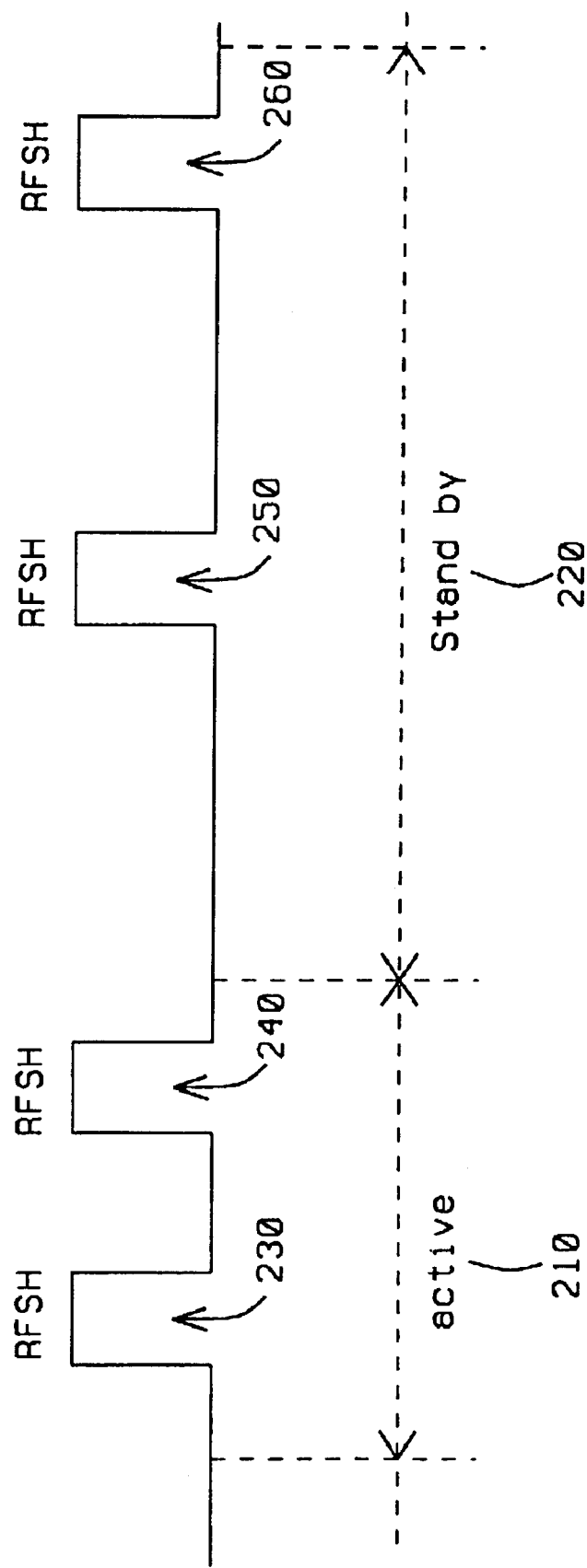
FIG. 2 shows a timing diagram which illustrates the main embodiment of the variable refresh frequency of this invention.

FIG. 2 shows a timing diagram, which is used to explain the main embodiment of this invention. Two refresh periods 230, 240 during active mode 210 are shown. Similarly, two refresh periods 250, 260 during standby mode 220 are shown. Since the two refresh periods 230, 240 are closer together in active mode 210 than in standby mode 220, the refresh frequency is higher in active mode than in standby mode. The refresh frequency during active mode needs to be typically higher than the refresh frequency during standby mode. FIG. 1a shows the mechanism which is used to refresh memory cells. FIG. 1b shows the mechanism whereby the data stored in memory cells can be corrupted by the switching noise produced by signal transitions on the word lines 115. The mechanism of this switching noise is illustrated in FIG. 1b and described in the prior art section of this patent. The sense amplifier, SA 120 is used to refresh or restore memory cells to their correct or intended values, whether logical '1' or logical '0'. This refresh operation needs to occur for all memory cells within a certain time period in a repeating ring order. This refreshing of memory cells needs to occur during active mode, which is the mode when the memory cells are being accessed for Writing data or for Reading data to and from the memory cells. In addition, this refreshing of memory cells needs to occur during standby mode, which is the mode when the memory cells are not being access for Writing data or Reading data to and from the memory cells. During standby mode, the word lines 140 are inactive as seen in FIG. 1a. The frequency of the refreshing of memory cells during both active mode and during standby mode is the essence of this invention.

Comparing the prior art to this invention, the following conclusions are made. The refresh frequency during active mode is higher than the prior art refresh frequency during active mode. Also, the refresh frequency during standby mode is lower than the prior art refresh frequency during standby mode. The present invention has a higher active mode refresh frequency to allow the faster restoration of cell data, which is degraded by capacitive discharge coupling through the selection of adjacent word lines as is demonstrated in FIG. 1b. During standby said word lines are not active. The refresh frequency during standby mode can be lowered since cell charge lost due to adjacent word line switching does not occur.

The use of a higher refresh frequency during active mode causes active mode power dissipation to be greater than in the prior art. This negative effect caused by the improved memory cell reliability and data integrity enhancement brought by the increased active mode refresh frequency must be compensated by a power reduction somewhere else. The answer lies in the lower refresh frequency during standby mode which causes standby mode power dissipation to be lower than in the prior art. In this invention, the higher power dissipation caused by the higher active mode refresh frequency is offset by the lower power dissipation due to the lower standby refresh frequency.

A count of word lines determines worse case cell degradation due to said capacitive coupling due to activity on said adjacent word lines. The worst case number of word lines switching at during a given time period determines the worst case possible unaccessed memory cell degradation caused by switching adjacent word lines as is illustrated in FIG. 1b. This worst case number in turn determines what higher refresh frequency is required during the active mode. This method and apparatus of this invention contain a flexible feature which allows the refresh frequency of active mode to vary according to the above worst case word line switching scenarios mentioned above.

Also in the method and apparatus of this invention is a flexible feature which allows the refresh frequency of standby mode to vary inversely according to the above-mentioned adjacent word line switching counts so as to compensate for the higher active mode power dissipation which results from the higher active mode refresh frequency. The refresh frequency during standby mode is decreased more to compensate for said required increase of said refresh frequency during active mode to insure power dissipation is compensated adequately to meet required design specifications.

The advantage of this invention is the flexible frequency choice for the active mode and for the standby mode of dynamic memory operation. The ability to select or choose a higher frequency for active mode allows the memory designer to increase the refresh frequency during active mode to protect memory cell data from adjacent word line, WL, disturbance. In addition, the flexible refresh operation allows the standby mode refresh frequency to be decreased an amount corresponding to the active mode refresh frequency increase mentioned above. This allows the decrease in standby refresh power dissipation to compensate for the increased active mode power dissipation caused by the higher refresh frequency specified in active mode.

While the invention has been described in terms of the preferred embodiments, those skilled in the art will recognize that various changes in form and details may be made without departing from the spirit and scope of the invention.

What is claimed is:

1. A method for providing a dynamic random access memory, DRAM, refresh with a flexible refresh frequency for active and standby mode comprising the step of:
   providing a higher refresh frequency during active mode than for standby mode, wherein said higher refresh frequency during active mode allows faster restoration of cell data, which is degraded by capacitive coupling through selection and switching of one or more adjacent word lines, and wherein said refresh frequency during standby mode can be lowered since cell charge lost due to adjacent word line switching does not occur.

2. The method for providing a dynamic random access memory, DRAM, refresh with a flexible refresh frequency for active and standby mode of claim 1 wherein said higher refresh frequency during active mode is higher than typically used refresh frequency during said active mode.

3. The method for providing a dynamic random access memory, DRAM, refresh with a flexible refresh frequency for active and standby mode of claim 1 wherein a refresh frequency during said standby mode is lower than said typically used refresh frequency during said stand by mode.

4. The method for providing a dynamic random access memory, DRAM, refresh with a flexible refresh frequency for active and standby mode of claim 1 wherein during standby said adjacent word lines are not active.

5. The method for providing a dynamic random access memory, DRAM, refresh with a flexible refresh frequency for active and standby mode of claim 1 wherein said higher refresh frequency during active mode causes a higher active mode power dissipation than in prior art.

6. The method for providing a dynamic random access memory, DRAM, refresh with a flexible refresh frequency for active and standby mode of claim 3 wherein said lower refresh frequency during standby mode causes a lower standby mode power dissipation than in prior art.

7. The method for providing a dynamic random access memory, DRAM, refresh with a flexible refresh frequency for active and standby mode of claim 6 wherein said higher active mode power dissipation caused by said higher refresh frequency during active mode is offset by said lower standby power dissipation due to said lower refresh frequency during standby mode.

8. The method for providing a dynamic random access memory, DRAM, refresh with a flexible refresh frequency for active and standby mode of claim 1 wherein a worst case count of word lines in an array determines worst case cell degradation due to said capacitive coupling due to signal switching activity on said adjacent word lines.

9. The method for providing a dynamic random access memory, DRAM, refresh with a flexible refresh frequency for active and standby mode of claim 8 wherein said worst case count of word lines in an array determines a higher refresh frequency required during said active mode.

10. The method for providing a dynamic random access memory, DRAM, refresh with a flexible refresh frequency for active and standby mode of claim 8 wherein a flexible feature allows said refresh with flexible frequency during said active mode to vary according to said worst case number of word lines.

11. The method for providing a dynamic random access memory, DRAM, refresh with a flexible refresh frequency for active and standby mode of claim 10 wherein said flexible feature allows said refresh frequency during standby mode to vary inversely according to said worst case number of word lines so as to compensate for higher active mode power dissipation.

12. The method for providing a dynamic random access memory, DRAM, refresh with a flexible refresh frequency for active and standby mode of claim 1 wherein said refresh frequency during standby mode is decreased more to compensate for said required increase of said refresh frequency during active mode to insure total memory power dissipation is minimized.

13. The method for providing a dynamic random access memory, DRAM, refresh with a flexible refresh frequency for active and standby mode of claim 1 wherein a sense amplifier is used to refresh memory cells as needed during a refresh time, wherein different refresh frequencies are used during said active mode versus said standby mode.

14. The method for providing a dynamic random access memory, DRAM, refresh with a flexible refresh frequency for active and standby mode of claim 13 wherein said refresh of said memory cells activate said adjacent word lines repeatedly.

15. An apparatus for providing a dynamic random access memory, DRAM, refresh with a flexible refresh frequency for active and standby mode comprising:
a refresh clock with higher frequency during active mode than for standby mode, wherein said higher refresh frequency during active mode allows faster restoration of cell data, which is degraded by capacitive coupling through selection and switching of one or more adjacent word lines, and wherein said refresh frequency during standby mode can be lowered since cell charge lost due to adjacent word line switching does not occur.

16. The apparatus for providing a dynamic random access memory, DRAM, refresh with a flexible refresh frequency for active and standby mode of claim 15 wherein said higher refresh frequency during active mode is higher than typically used refresh frequency during said active mode.

17. The apparatus for providing a dynamic random access memory, DRAM, refresh with a flexible refresh frequency for active and standby mode of claim 15 wherein a refresh frequency during standby mode is lower than said typically used refresh frequency during said standby mode.

18. The apparatus for providing a dynamic random access memory, DRAM, refresh with a flexible refresh frequency for active and standby mode of claim 15 wherein during standby said adjacent word lines are not active.

19. The apparatus for providing a dynamic random access memory, DRAM, refresh with a flexible refresh frequency for active and standby mode of claim 15 wherein said higher refresh frequency during active mode causes a higher active mode power dissipation than in prior art.

20. The apparatus for providing a dynamic random access memory, DRAM, refresh with a flexible refresh frequency for active and standby mode of claim 17 wherein said lower refresh frequency during standby mode causes a lower standby mode power dissipation than in prior art.

21. The apparatus for providing a dynamic random access memory, DRAM, refresh with a flexible refresh frequency for active and standby mode of claim 20 wherein said higher active mode power dissipation caused by higher refresh frequency during active mode is offset by said lower standby power dissipation due to said lower refresh frequency during standby mode.

22. The apparatus for providing a dynamic random access memory, DRAM, refresh with a flexible refresh frequency for active and standby mode of claim 15 wherein a worst case count of word lines in an array determines worst case cell degradation due to said capacitive coupling due to signal switching activity on said adjacent word lines.

23. The apparatus for providing a dynamic random access memory, DRAM, refresh with a flexible refresh frequency for active and standby mode of claim 22 wherein said worst case count of word lines in an array determines a higher refresh frequency required during said active mode.

24. The apparatus for providing a dynamic random access memory, DRAM, refresh with a flexible refresh frequency for active and standby mode of claim 22 wherein a flexible feature allows said refresh with flexible frequency during said active mode to vary according to said worst case number of word lines.

25. The apparatus for providing a dynamic random access memory, DRAM, refresh with a flexible refresh frequency for active and standby mode of claim 24 wherein said flexible feature allows said refresh frequency during standby mode to vary inversely according to said worst case number of word lines so as to compensate for higher active mode power dissipation.

26. The apparatus for providing a dynamic random access memory, DRAM, refresh with a flexible refresh frequency for active and standby mode of claim 15 wherein said refresh frequency during standby mode is decreased more to compensate for said required increase of said refresh frequency during active mode to insure total memory power dissipation is minimized.

27. The apparatus for providing a dynamic random access memory, DRAM, refresh with a flexible refresh frequency for active and standby mode of claim 15 wherein a sense amplifier is used to refresh said memory cells ass needed during a refresh time, wherein different refresh frequencies are used during said active mode versus said standby mode.

28. The apparatus for providing a dynamic random access memory, DRAM, refresh with a flexible refresh frequency for active and standby mode of claim 27 wherein said refresh of said memory cells activate said adjacent word lines repeatedly.

* * * * *